United States Patent
Panhofer

(10) Patent No.: US 6,873,201 B2
(45) Date of Patent: Mar. 29, 2005

(54) CIRCUIT ARRANGEMENT AND METHOD FOR ACTUATING A SEMICONDUCTOR SWITCH CONNECTED IN SERIES WITH AN INDUCTIVE LOAD

(75) Inventor: Harald Panhofer, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/745,179

(22) Filed: Dec. 23, 2003

(65) Prior Publication Data

US 2004/0164787 A1 Aug. 26, 2004

(30) Foreign Application Priority Data

Dec. 30, 2002 (DE) .......................... 102 61 433

(51) Int. Cl.[7] .......................... H03K 17/687
(52) U.S. Cl. ...................... 327/427; 327/434
(58) Field of Search .............. 327/374–377, 327/379, 383–384, 387, 389, 427, 434, 437, 170

(56) References Cited

U.S. PATENT DOCUMENTS

| | | | | |
|---|---|---|---|---|
| 5,552,731 A | * | 9/1996 | Diazzi et al. | 327/109 |
| 5,572,156 A | * | 11/1996 | Diazzi et al. | 327/109 |
| 5,663,667 A | * | 9/1997 | Blum et al. | 327/134 |
| 5,719,521 A | * | 2/1998 | Wong | 327/434 |
| 6,194,951 B1 | | 2/2001 | Allmeier | 327/424 |
| 6,456,156 B1 | * | 9/2002 | Frey et al. | 327/541 |

* cited by examiner

Primary Examiner—My-Trang Nu Ton
(74) Attorney, Agent, or Firm—Dicke, Billig & Czaja, PLLC

(57) ABSTRACT

A circuit arrangement is provided for actuating a semiconductor switch connected in series with an inductive load. The circuit includes a first input terminal for supplying an input signal which governs whether the semiconductor switch is on or off, a second input terminal for supplying a voltage measurement signal, and an output terminal for providing an actuation signal for the semiconductor switch. Connected between the first input terminal and the output terminal is a driver circuit which, for a given level of the input signal, takes a control signal as a basis for generating an actuation signal having a first or a second signal profile. To generate the control signal, a control signal generation circuit is provided which takes a stipulation by the first input signal as a basis for sensing a value of the voltage measurement signal in order to provide a sample value and generates the control signal on the basis of a comparison between the instantaneous voltage measurement signal, or a signal which is dependent thereon, and a reference value which is dependent on the sample value, or the sample value itself.

22 Claims, 7 Drawing Sheets

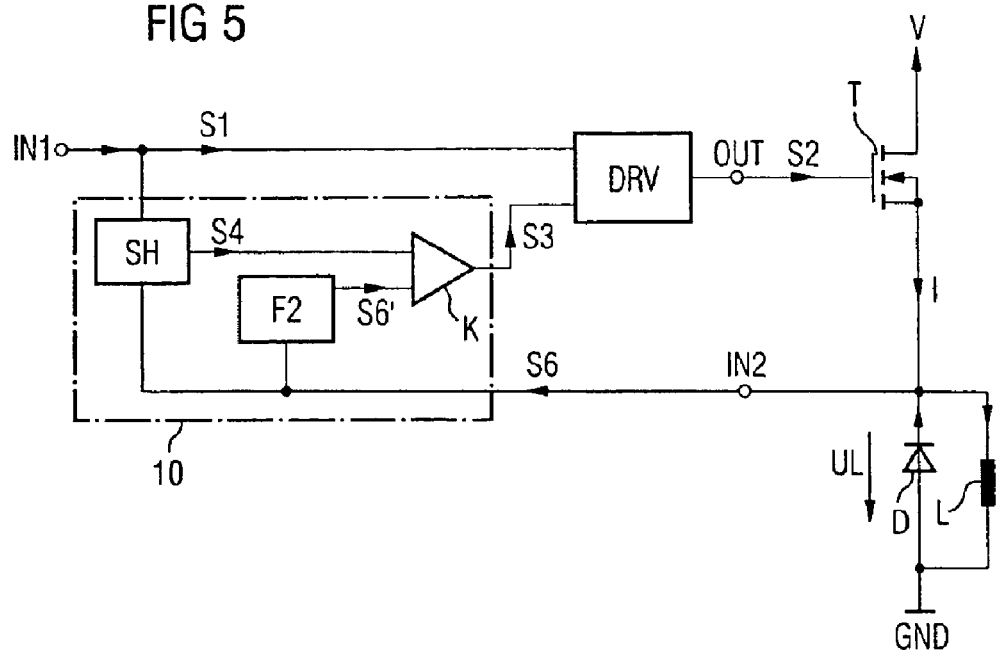
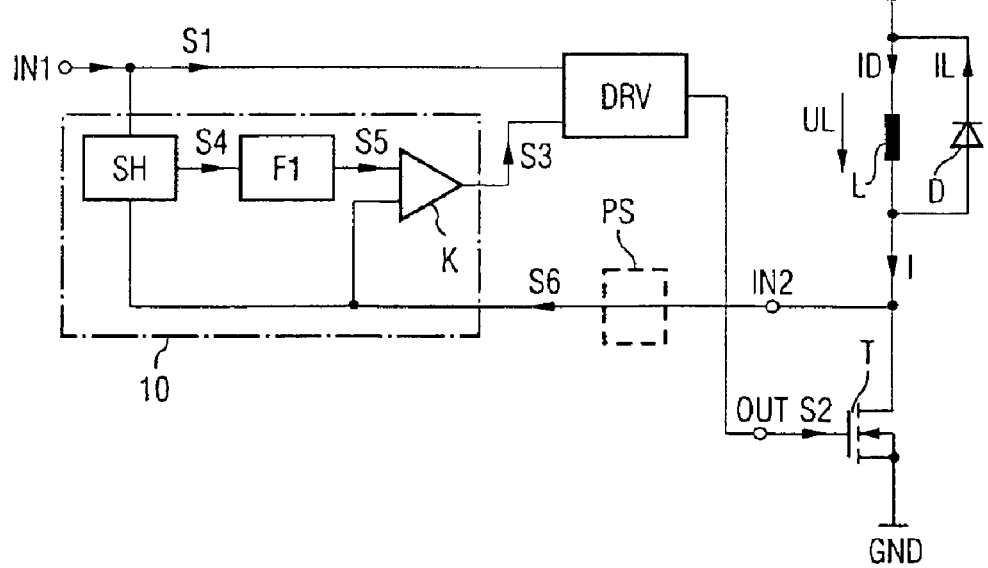

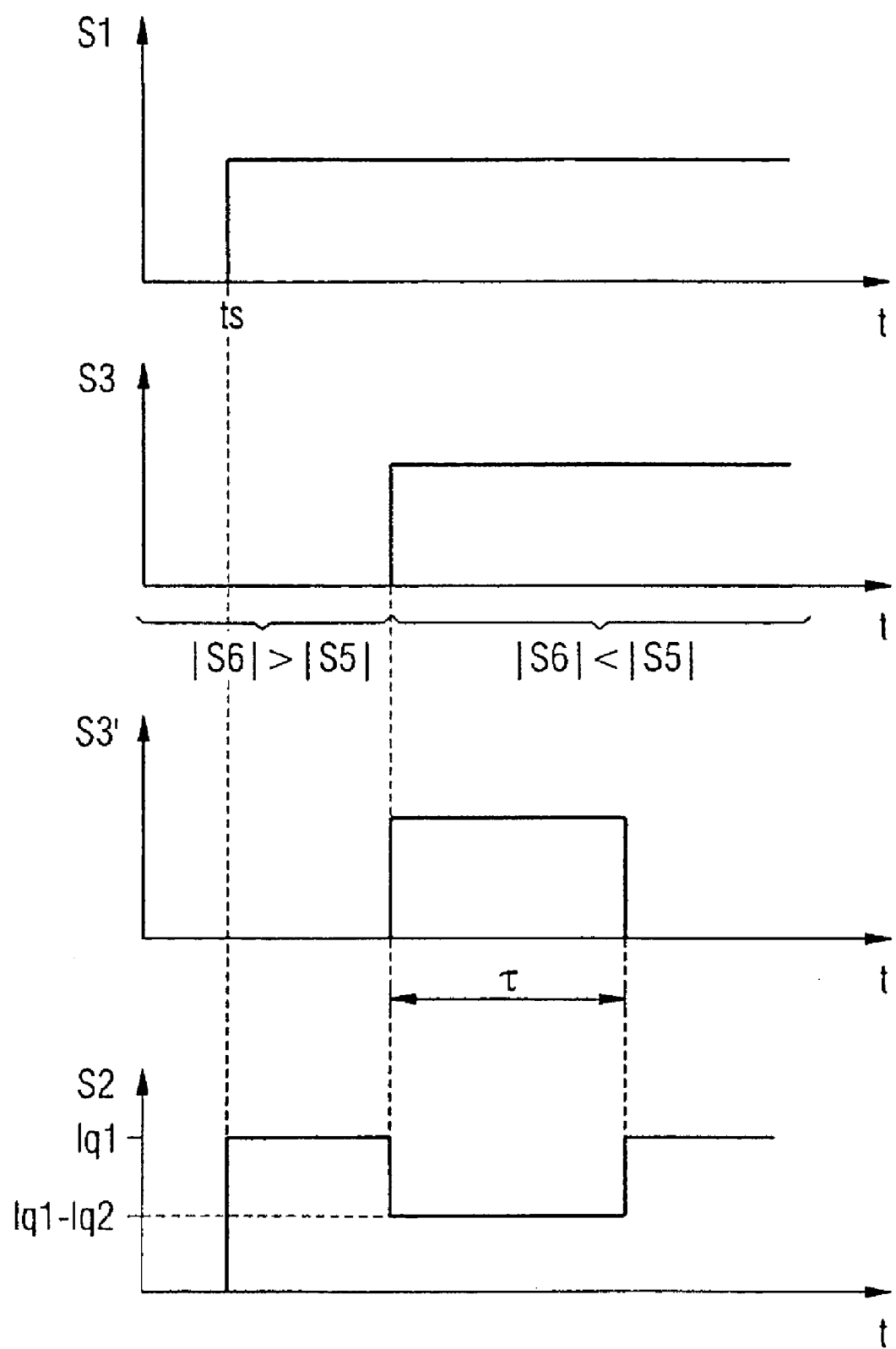

CIRCUIT ARRANGEMENT AND METHOD FOR ACTUATING A SEMICONDUCTOR SWITCH CONNECTED IN SERIES WITH AN INDUCTIVE LOAD

CROSS-REFERENCE TO RELATED APPLICATIONS

This Utility Patent Application claims priority to German Patent Application No. DE 102 61 433.4, filed on Dec. 30, 2002, which is incorporated herein by reference.

BACKGROUND

The present invention relates to a circuit arrangement and a method for the clocked actuation of a semiconductor switch connected in series with an inductive load, and in particular, a circuit configured to reduce electromagnetic radiated interference, which arises during switching processes.

FIG. 1 illustrates a prior art series circuit (connected between a supply potential V and reference-ground potential GND) comprising a semiconductor switch in the form of a power transistor T and comprising an inductive load having a freewheeling diode D connected in parallel with the load. With clocked actuation of the semiconductor switch, a current flows via the semiconductor switch T and the load L to reference-ground potential GND during the periods in which the semiconductor switch T is on. While the semiconductor switch T is subsequently off, the energy stored in the coil beforehand causes a current to flow from the coil via the freewheeling diode, as a result of which the coil turns off. If the periods for which the semiconductor switch T is off in this case are so short that the load L is not respectively able to turn off completely during these periods, then after the semiconductor switch T has turned on a current continues to flow via the diode D, said current decreasing as the length of time for which the semiconductor switch is on increases. In this case, electromagnetic radiated interference is particularly great at the time at which a flow of current ID through the diode ends and the total current through the load L is taken on by the semiconductor switch T. At this time, the arithmetic sign of the voltage UL present across the diode D and the coil changes from a value that is negative with respect to reference-ground potential GND to a positive value.

In this case, it holds that the electromagnetic radiated interference is more intense the greater the inductance of the load L and hence the change in current in the semiconductor switch T.

To reduce electromagnetic radiated interference, it is known practice to actuate the semiconductor switch T using a suitable actuation circuit (not shown in more detail) such that edges of the load current profile have a shallow gradient. A drawback in this context is that the semiconductor switch T is on for a correspondingly long time, which limits the maximum switching frequency for clocked actuation of the semiconductor switch.

To reduce electromagnetic radiated interference, attempts are therefore made to identify the time interval for the maximum change in current in the semiconductor switch in order to be able to flatten or round off the edges of the current profile during this period of time by means of suitable actuation of the semiconductor switch. This flattening of the edges is done, for example, by temporarily limiting the semiconductor switch somewhat using a suitable actuation circuit in order to increase the semiconductor switch's load path resistance and thereby to reduce the change in the load current through the semiconductor switch T. By way of example, the limiting is effected by temporarily reducing the gate charging current in a semiconductor switch in the form of a power MOSFET.

To detect the interval of maximum changes in current, it is possible to evaluate the voltage across the diode D or across the load L. FIG. 2 schematically illustrates the time profile for the voltage drop across the diode D, where ts denotes a time at which the initially off semiconductor switch T is turned on again. At first, this voltage UL remains at a negative value whose magnitude is dependent on the coil current, and it then rises quickly toward positive values, the total current being taken on by the semiconductor switch T from the time at which the voltage UL becomes positive.

To detect this rising edge, the voltage drop across the diode can be compared with a prescribed reference value which is between the forward voltage of the diode D and reference-ground potential GND, and the semiconductor switch T can be actuated such that the current edge is flattened as soon as the diode voltage UL reaches the reference voltage.

This practice has two drawbacks, however. First, after initially remaining approximately constant at a negative value, the voltage across the diode D rises very quickly to positive values. Usual periods of time for the transition between the negative voltage value with the greatest magnitude and positive values are between 100 ns and 300 ns. Detection of this steep edge using the reference value Uref presupposes a fast comparator circuit and also a fast actuation circuit in order to start rounding off the current edge through suitable actuation of the semiconductor switch T even before positive voltage values are reached and the semiconductor switch then takes on the total current. This can be achieved, by way of example, using circuits in bipolar technology, which can be implemented only with a greater areal involvement than CMOS circuits, however. In addition, fast comparator and actuation circuits can be implemented only with a high level of circuit complexity, which means additional areal involvement.

Second, the choice of switching threshold influences the electromagnetic interference and the maximum possible switching frequency of the semiconductor switch. If the switching threshold is chosen to be too high, for example just a little lower than reference-ground potential GND, then flattening of the switching edges starts too late and the electromagnetic radiated interference is barely reduced. If the switching threshold is too low, flattening of the switching edge starts too early and the period of time before the semiconductor switch turns on completely increases. In the example in FIG. 2, the threshold is below the minimum value which the diode voltage reaches for an assumed coil current of 1A, which means that the switching edges are always flattened on the basis of a comparison between the diode voltage and the reference voltage. In general, it holds that the smaller the impressed coil current on which the voltage drop across the diode is dependent, the earlier flattening of the current edge starts and the longer the turn-on process takes.

SUMMARY

In one embodiment of the present invention, a circuit arrangement and a method is provided for actuating a semiconductor switch connected in series with an inductive load, where a short length of time is achieved for which the semiconductor switch is on with little electromagnetic radiated interference.

In one embodiment, the circuit arrangement for actuating a semiconductor switch connected in series with an inductive load comprises a first input terminal for supplying an input signal which governs whether the semiconductor switch is on or off, a second input terminal for supplying a voltage measurement signal, and an output terminal for providing an actuation signal for the semiconductor switch. Connected between the first input terminal and the output terminal is a driver circuit which, for a given level of the input signal, takes a control signal as a basis for generating an actuation signal having a first or a second signal profile. To generate the control signal, a control signal generation circuit is provided which takes a stipulation by the first input signal as a basis for sensing a value of the voltage measurement signal in order to provide a sample value and generates the control signal on the basis of a comparison between the instantaneous voltage measurement signal, or a signal which is dependent thereon, and a reference value that is dependent on the sample value, or the sample value itself.

In one embodiment, the circuit arrangement provides an actuation signal for the semiconductor switch having a first or a second signal profile, one of the signal profiles being chosen such that the edges of the current profile through the semiconductor switch are flattened. In this case, the flattening/rounding off starts on the basis of an adaptively set reference value which is ascertained by ascertaining the value of a voltage across the load using the voltage measurement signal when the semiconductor switch starts to be turned on on the basis of the input signal, and forming the reference value from this voltage value.

An embodiment of the circuit arrangement also works with a small duty ratio for the semiconductor switch, since the threshold for starting to round off the current edge is respectively ascertained on the basis of the voltage across the load and the freewheeling diode and hence on the basis of the impressed current. A fast comparator is not necessary in the circuit arrangement in accordance with the invention, since the reference value can be set in terms of the voltage reversal point, at which the voltage across the load changes its arithmetic sign, such that the comparator still has sufficient time to switch before the arithmetic sign of the voltage across the load changes. It is thus possible for the inventive circuit to use slower circuits, but ones which can be implemented with less areal involvement, for example in CMOS technology, as compared with faster and hence more complex circuits, for example in bipolar technology.

In one embodiment of the invention, the reference value at which, when reached, rounding off of the current edges is started is preferably at a fixed ratio to the voltage measurement signal or to the voltage across the load at the start of the turn-on process and is between 60% and 95% of the sample value, preferably between 70% and 80% of the sample value, for example.

Alternatively, the voltage measurement signal is used to ascertain a signal which is dependent thereon and which is at a fixed ratio to the voltage measurement signal and is compared directly with the sample value.

To generate the control signal in accordance with one embodiment of the present invention, the control signal generation circuit comprises a sensing element for sensing the amplitude of the voltage measurement signal, to which the input signal and the voltage measurement signal are supplied and which takes a stipulation by the input signal as a basis for sampling the voltage measurement signal and provides a sample value that is dependent on the voltage measurement signal, a reference value generation circuit that provides the reference value from the sample value, and a comparator arrangement that compares the sample value with the voltage measurement signal, or a signal that is dependent thereon, and provides the control signal on the basis of the comparison result.

In one embodiment of the invention, the sensing element is in the form of a sample and hold element that takes a stipulation by the input signal as a basis for sampling the voltage measurement signal.

In a further embodiment, the sensing element is in the form of a peak value sensing and storage element that senses the peak value of the voltage measurement signal during a period in which the input signal has a prescribed level, and provides this peak value as a sample value during the next period. The periods during which the peak value of the voltage measurement signal is sensed are the periods for which the semiconductor switch is on.

In one embodiment, the driver circuit is in a form such that, for a first level of the input signal at which the semiconductor switch is intended to be turned on, it takes the binary control signal as a basis for generating an actuation signal having a first signal profile or a second signal profile, with the signal profile, which is set when the voltage measurement signal or the signal that is dependent thereon reaches the reference value, effecting rounding off of the current edges of the load current through the semiconductor switch. When using a MOSFET as the semiconductor switch, this rounding off of the current edges is achieved, by way of example, by reducing the semiconductor switch's gate charging current for a prescribed period of time.

In one embodiment, the inventive method for generating an actuation signal for a semiconductor switch connected in series with an inductive load comprises an input signal which governs whether the semiconductor switch needs to be on or off and a voltage measurement signal that is dependent on a voltage across the load being provided, the voltage measurement signal being sampled on the basis of a stipulation by the input signal in order to provide a sample value that is dependent on the voltage measurement signal, the voltage measurement signal being compared with a reference value that is dependent on the sample value in order to generate a control signal, and, for a given level of the input signal, the actuation signal being generated with a first or a second signal profile on the basis of the control signal.

In one exemplary embodiment, the reference value is between 60% and 95% of the sample value, preferably between 70% and 80% of the sample value.

In this context, one of the two signal profiles is chosen such that the edges of a current through a semiconductor switch actuated using the actuation signal are rounded off for the length of time of this signal profile.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5 illustrates another exemplary embodiment of an inventive circuit arrangement for actuating a semiconductor switch which is connected in series with an inductive load and is used as a high side switch, FIG. 6 illustrates an exemplary embodiment of an inventive circuit arrangement for actuating a semiconductor switch which is connected in series with an inductive load and is used as a low side switch.

FIG. 9 illustrates exemplary signal profiles for the input and output signals of the driver circuits shown in FIGS. 8a and 8b.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
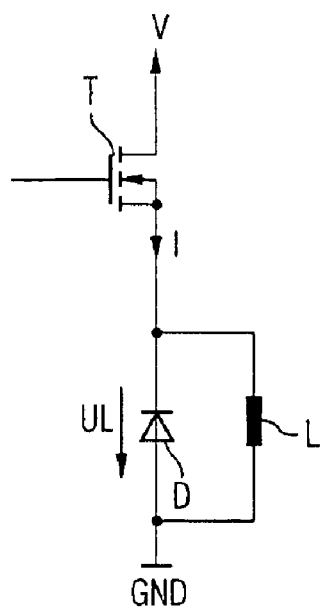
FIG. 1 illustrates a prior art series circuit with a semiconductor switch and an inductive load.
Figure 2:
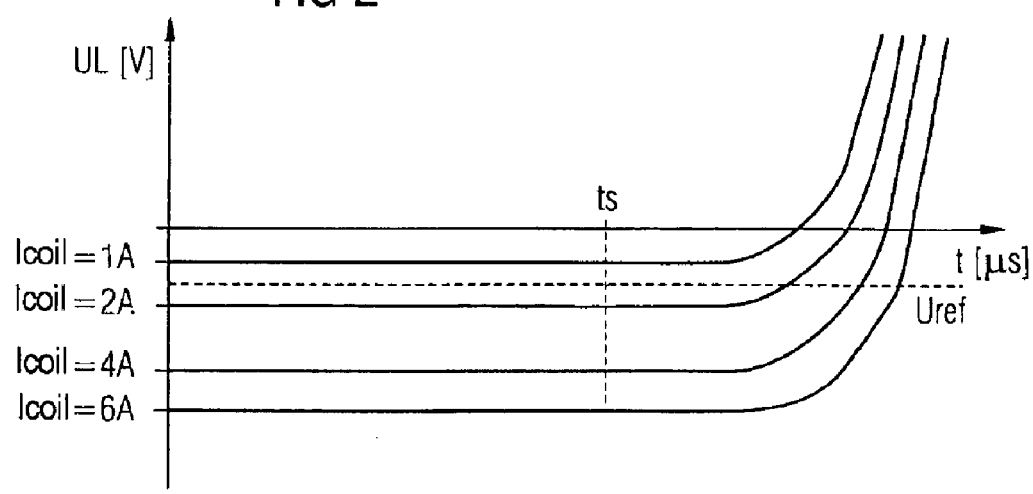
FIG. 2 illustrates the voltage profile across the load when the switch is off before a time ts and when the semiconductor switch is on starting from a time ts.
Figure 3:
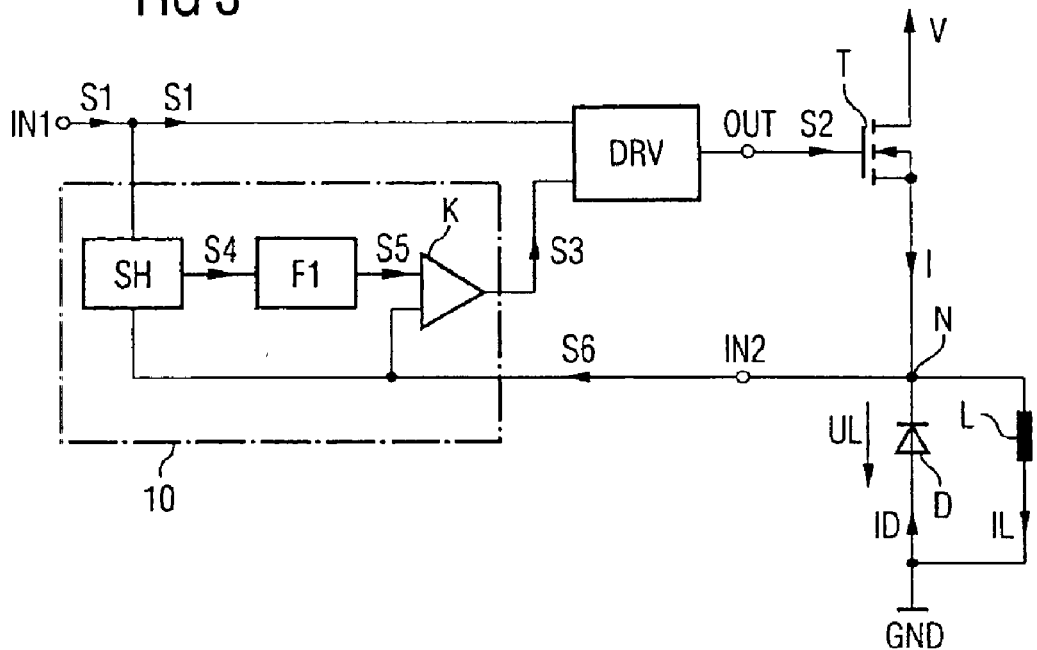
FIG. 3 illustrates an inventive circuit arrangement for actuating a semiconductor switch which is connected in series with an inductive load and is used as a high side switch, with a driver circuit and a control signal generation circuit.

FIG. 3 illustrates an exemplary embodiment of an inventive actuation circuit for actuating a semiconductor switch connected in series with an inductive load. To improve understanding of the inventive actuation circuit, FIG. 1 illustrates such a series circuit with a semiconductor switch T in the form of an n-channel MOSFET and an inductive load L, this series circuit being connected between a supply potential V and reference-ground potential GND. Connected in parallel with the inductive load L is a freewheeling diode D, which allows the coil to turn off when the semiconductor switch T is first on and is then off.

The actuation circuit comprises a first input terminal IN1 for supplying an input signal S1 which governs whether the semiconductor switch T is on or off, and a second input terminal IN2 for supplying a voltage measurement signal S6, which is dependent on a voltage UL across the load and, in the example shown, matches the load voltage UL taking reference-ground potential as a reference. The actuation circuit also comprises an output terminal OUT for providing an actuation signal S2 on the basis of the input signal S1 and the voltage measurement signal S6. Connected between the input terminal IN1 and the output terminal OUT is a driver circuit DRV to which the input signal S1 and a control signal S3 are supplied. This control signal S3 is generated by a control signal generation circuit 10, to which the input signal S1 and the voltage measurement signal S6 are supplied, by sampling the voltage measurement signal S6 on the basis of a stipulation by the input signal S1 in order to provide a sample value S4, and by generating the control signal S3 on the basis of a comparison between the voltage measurement signal S6, or a signal related thereto, and a reference value S5 which is dependent on the sample value.

The control signal generation circuit 10 shown in FIG. 3 comprises an amplitude sensing element SH, which is in the form of a sample and hold element, and to which the input signal S1 and the voltage measurement signal S6 are supplied. The sample and hold circuit samples the voltage measurement signal S6 upon a prescribed edge of the input signal S1 and provides a sample value S4, which corresponds to the voltage measurement signal S6 at the sampling time, or which is linearly related to the voltage measurement signal S6 at the sampling time. The sample value S4 is supplied to a function circuit F1, which takes this sample value S4 and generates a reference value S5, which is dependent on this sample value S4. In this case, the reference value S5 is preferably proportional to the sample value S4 or to the magnitude of the sample value S4, but can also be related to the sample value by means of a nonlinear relationship, e.g. quadratic. A comparator K connected downstream of the function circuit F1 compares the reference value S5 with the respective instantaneous value of the voltage measurement signal S6 and provides the control signal S3 on the basis of this comparison.

The sensing element SH can also be in the form of a peak value sensing and storage circuit, which senses a peak value of the voltage measurement signal S6 during a period prescribed by the input signal S1 in which the semiconductor switch T is on, and provides this peak value as a sample value S4 during the subsequent on period.

The driver circuit DRV is designed to provide an actuation signal S2, which turns on the semiconductor switch T when the input signal S1 is at a first level, for example a high level. The signal profile or the level of this output signal S2 for turning on assumes one of two different levels on the basis of the value of the control signal S3.

The control signal S2 is used for turning on the semiconductor switch T and is usually a current which is used to charge the gate-source capacitance (not shown in more detail) of the MOSFET T1 in order to turn the latter on. In this case, the amplitude of this current determines the "turn-on speed" at which the MOSFET turns on, that is to say reduces its load path resistance, or determines the speed at which the load current I through the semiconductor switch rises. In this context, the electromagnetic radiated interference arising upon turning on is dependent on the speed at which the load current I rises or on the gradient of the current edge.

The two levels of the actuation signal S2, which are set on the basis of a stipulation by the control signal, are chosen, in line with the invention, such that for one of the levels the turn-on speed is very high, that is to say that the gate-source capacitance is charged very quickly, while for the other level the turn-on speed is reduced, that is to say that the gate-source capacitance is charged more slowly, in order to reduce the current edges.

For the sake of completeness, it may be pointed out that the actuation signal assumes a third level, which is not considered in more detail below, however, in order to turn off the semiconductor switch, since the actuation circuit shown is used only for turning on the semiconductor switch T. The semiconductor switch is turned off by means of an arrangement (not shown in more detail) which is used for discharging the gate-source capacitance in the off instance.

The way in which the inventive actuation circuit shown in FIG. 3 works is explained below with reference to FIG. 4, which shows time profiles for the load voltage UL for various currents IL impressed on the inductive load L. In general, it holds for the series circuit comprising the semiconductor switch T and the load L with a freewheeling diode D that, when the semiconductor switch T is on, a current flows from supply potential V via the semiconductor switch T and the inductive load L to reference-ground potential GND, while the freewheeling diode D is off. When the semiconductor switch T is subsequently off, the energy stored beforehand in the coil causes a freewheeling current ID to flow via the freewheeling diode D. This freewheeling current ID is dependent on the load current flowing beforehand with the semiconductor switch on, and this load current in turn is dependent on the length of time for which the semiconductor switch is on, and is larger the longer the semiconductor switch T remains turned on for each turn-on process. The magnitude of the voltage present across the freewheeling diode D in the freewheeling instance is dependent on this impressed current IL and is greater the larger this impressed current IL. The potential on the node N which is common to the semiconductor switch T and to the load L and on which the voltage signal S6 is tapped off in FIG. 3 is negative with respect to the reference-ground potential GND in the freewheeling instance, as illustrated in FIG. 4, in which the reference-ground potential represents the voltage zero line.

Figure 4:
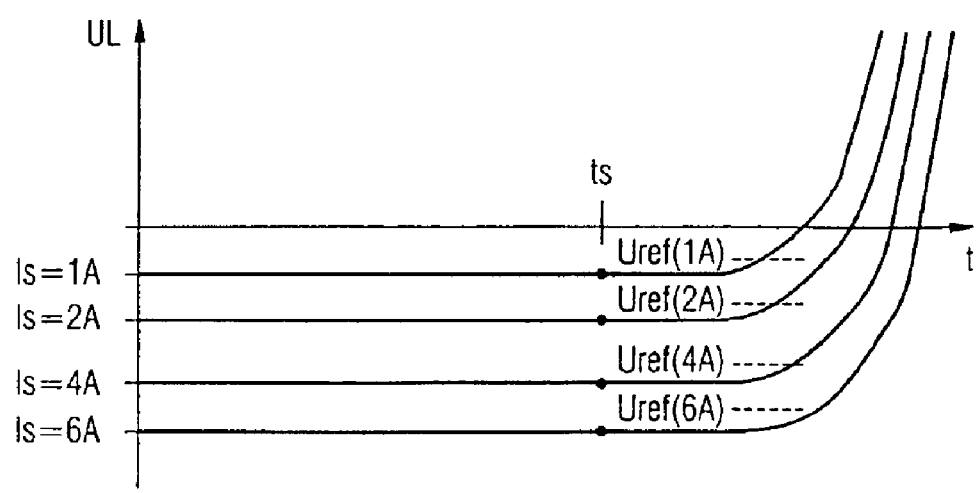
FIG. 4 illustrates the voltage profile across the load when the switch is off before a time ts and when the semiconductor switch is on starting from a time ts, and the position of the reference values.

In FIG. 4, the time ts denotes the time at which the semiconductor switch T is turned on again. In this case, the voltage UL across the load L and the freewheeling diode D with respect to reference-ground potential remains approximately constant at first at the value of the voltage present beforehand during the freewheeling instance and then rises quickly toward positive values, with the total coil current being taken on by the semiconductor switch T starting from the time from which the voltage characteristic intersects the zero line.

The driver circuit DRV is in a form such that the semiconductor switch T is turned on by means of the input signal S1 at the time ts. At the same time, the voltage measurement signal S6 is sampled at this time ts and this instantaneous value of the voltage measurement signal is used to provide the reference value S5 via the function circuit F. The reference value S5 is used to identify that edge of the profile of the voltage UL across the load L and the freewheeling diode which rises starting from negative values toward positive values, and to reduce the turn-on speed of the semiconductor switch using the control signal S3, the driver circuit DRV and the actuation signal S2 until the load voltage UL has reached positive values. The turn-on speed of the semiconductor switch is reduced in the manner explained above by, for example, reducing the gate-source capacitance's charging current, which is represented by the actuation signal. As a result, the edge of the current profile I through the semiconductor switch T is flattened and electromagnetic radiated interference is reduced, this interference being particularly great in the transition region in which there is a transition from negative load voltages to positive load voltages.

For each of the voltage profiles shown for different load currents, FIG. 4 depicts reference values, denoted by Uref (1A) to Uref(6A), which correspond to the reference signal S5 in FIG. 3. These reference voltages are at a fixed ratio to the instantaneous value of the respective voltage UL at the turn-on time ts and are between the instantaneous value at the turn-on time ts and the zero line. In the exemplary embodiment shown, these reference values have been chosen such that their amplitude with respect to reference-ground potential is 80% of the amplitude of the load voltage UL or of the voltage measurement signal S6 at the turn-on time ts. To generate such reference values, the function circuit F1 takes the sample value S4 obtained from the voltage measurement signal S6 at the turn-on time t6 and forms a reference value S5 whose amplitude corresponds to 80% of the sample value S4. It goes without saying that it is also possible to set other dependences between the reference value S5 and the sample value S4. The comparator K is in a form such that a level change in the control signal S3 takes place when the magnitude of the voltage measurement signal S6 is smaller than the magnitude of the reference value S5, so as thereby to start rounding off the current edge in good time before the load voltage UL has fallen to zero and the total coil current UL is taken on by the semiconductor switch T.

FIG. 5 illustrates an inventive circuit arrangement with a control signal generation circuit 10 which is modified as compared with the example in FIG. 3. In the example, a sample signal S4 generated from the voltage measurement signal by the sample and hold element SH is supplied directly to the comparator K, while a function circuit F2 is used to generate a modified voltage measurement signal S6' from the voltage measurement signal S6 and to supply it to the comparator. In line with the example in FIG. 3, in the example shown in FIG. 5 the ratio of the sample signal S4 to the modified voltage measurement signal determines the threshold starting from which the control signal is intended to be used to initiate a reduction in the switching edges. In the example, in order to place this threshold at a point at which the voltage measurement signal has fallen to a value which corresponds to 80% of the sample value, the voltage measurement signal is multiplied by a factor 1/0.8=1.25 in the function circuit. Hence, flattening of the current edges starts, using the control signal S3 and the driver circuit, when 1.25 times the amplitude of the voltage measurement signal has fallen below the value of the sample signal S5.

Figure 7:
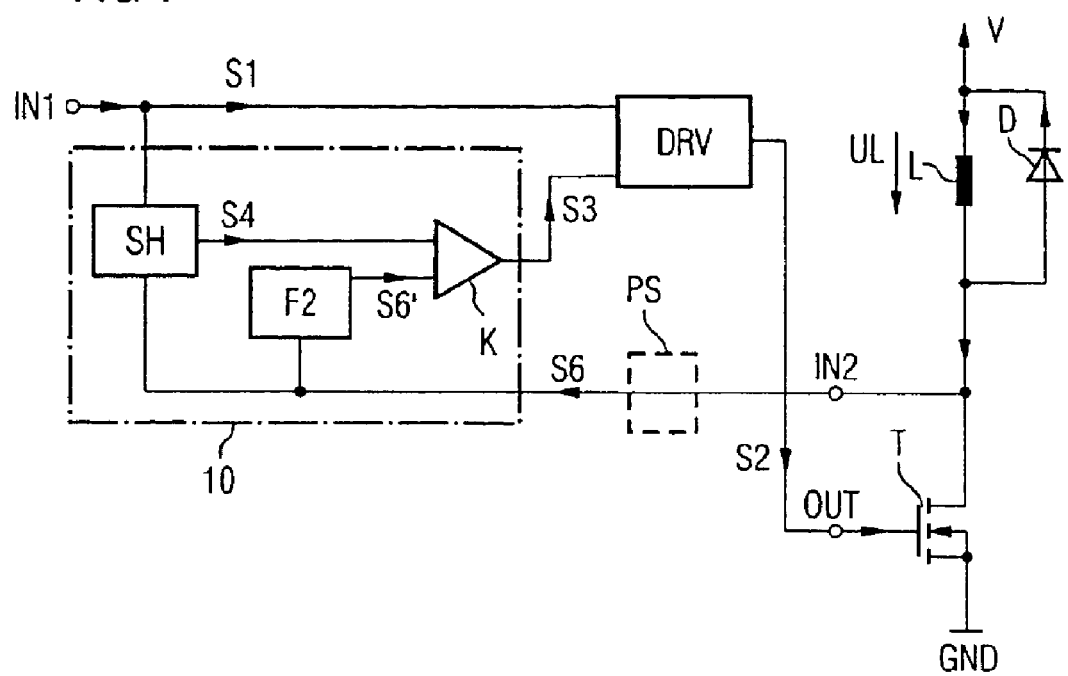
FIG. 7 illustrates another exemplary embodiment of an inventive circuit arrangement for actuating a semiconductor switch which is connected in series with an inductive load and is used as a low side switch.

The invention is not limited to the actuation of high side switches, as shown by FIGS. 6 and 7. FIG. 6 illustrates an actuation circuit which corresponds to the actuation circuit in FIG. 3 and is used for actuating a low side switch, that is to say a switch which is connected between the inductive load L and reference-ground potential GND. In this example, the voltage across the load L is likewise tapped off on a node between the inductive load L and the semiconductor switch T, with the load path voltage UL in this case taking supply potential as a reference. This voltage can be processed immediately, provided that the control signal generation circuit is designed to process signals which take supply potential as a reference. Otherwise, the voltage measurement signal S6 is generated from the load voltage UL using a level shifter PS (shown in dashes), in which case the voltage measurement signal takes reference-ground potential GND as a reference.

FIG. 7 illustrates a modification of the actuation circuit shown in FIG. 6. Whereas, in the circuit shown in FIG. 6, the sample signal is supplied to a function circuit F1 and then to the comparator K in line with the statements relating to FIG. 3, the voltage measurement signal S6 in the circuit shown in FIG. 7 is supplied to a function circuit F2 and then to the comparator K.

Figure 8A:
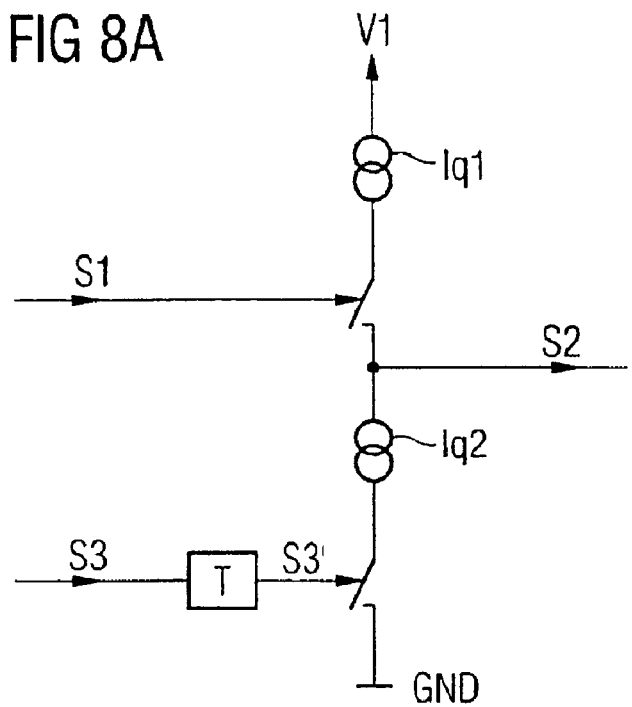
FIG. 8a illustrates an exemplary embodiment of circuitry for a driver circuit in line.

FIG. 8a illustrates an exemplary embodiment of a driver circuit DRV which generates an actuation signal S2 having different actuation levels on the basis of the input signal S1 and the control signal S3. The driver circuit comprises a series circuit, connected between an actuation potential V1 and the output terminal OUT, with a first current source Iq1 and a first switch SW1, which is actuated by the input signal S1. The driver circuit also comprises a series circuit, connected between the output terminal OUT and reference-ground potential GND, with a second current source Iq2 and a second switch SW2, which is actuated on the basis of the control signal S3.

FIG. 9 illustrates, by way of example, a signal profile for the input signal S1, for the control signal S3 and for the output signal S2 for this driver circuit. At the time ts, the input signal S1 assumes a high level in order to turn on a semiconductor switch T in line with FIG. 3. For this purpose, a charging current delivered by the current source Iq1 flows to the output connection OUT and hence to the control connection (gate connection) of the semiconductor switch T. In this case, the output signal S2 corresponds to the current delivered by the current source Iq1. After the turn-on time ts, the control signal S3 remains at a low level at first and then assumes a high level if, as explained above, the voltage UL across the load L, or the voltage measurement signal S6, reaches the reference value. At this time, the switch SW2 is turned on using a timer T, as a result of which the charging current at the output OUT is reduced by the value of the current delivered by the second current source Iq2, in order to reduce the turn-on speed of the semiconductor switch as a result and thereby to flatten the current edge of the load current I. By way of example, the timer T has been chosen such that the switch SW2 remains turned on after a rising edge of the control signal S3 for a prescribed delay time τ which is chosen to be of a length such that the switch SW2 is not turned off again until after the voltage UL across the load L has risen toward positive values. This ensures that the turn-on speed of the semiconductor switch T during the transition from negative to positive load voltage values UL, that is to say while the greatest electromagnetic radiated interference would arise, is reduced in order to reduce the Electromagnetic radiated interference as a result.

Figure 8B:
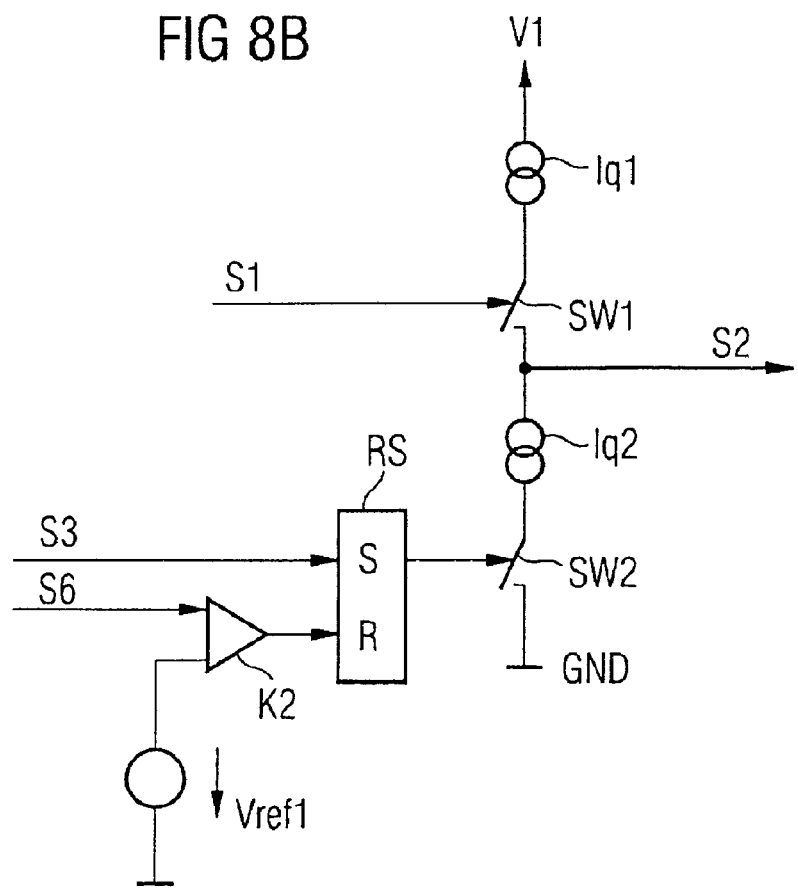
FIG. 8b illustrates another exemplary embodiment of circuitry for a drive circuit in line.

FIG. 8b illustrates another exemplary embodiment of a possible driver circuit DRV, which differs from that shown in FIG. 8a in that the second switch SW2 is actuated by an RS flipflop. This flipflop S3 is set when the control signal S3 changes from a low level to a high level on the basis of the comparison between the reference value S5 and the voltage measurement signal. This flipflop is reset, in order to turn off the switch SW2 again, when the voltage measurement signal S6 has risen via a positive reference value VRF1. This ensures that the switch SW2 is not turned off again, in order to actuate the semiconductor switch T at full level and to end rounding off of the current edge, until the load voltage UL is positive and the semiconductor switch T has thus taken on the total current through the load L.

Figure 10:
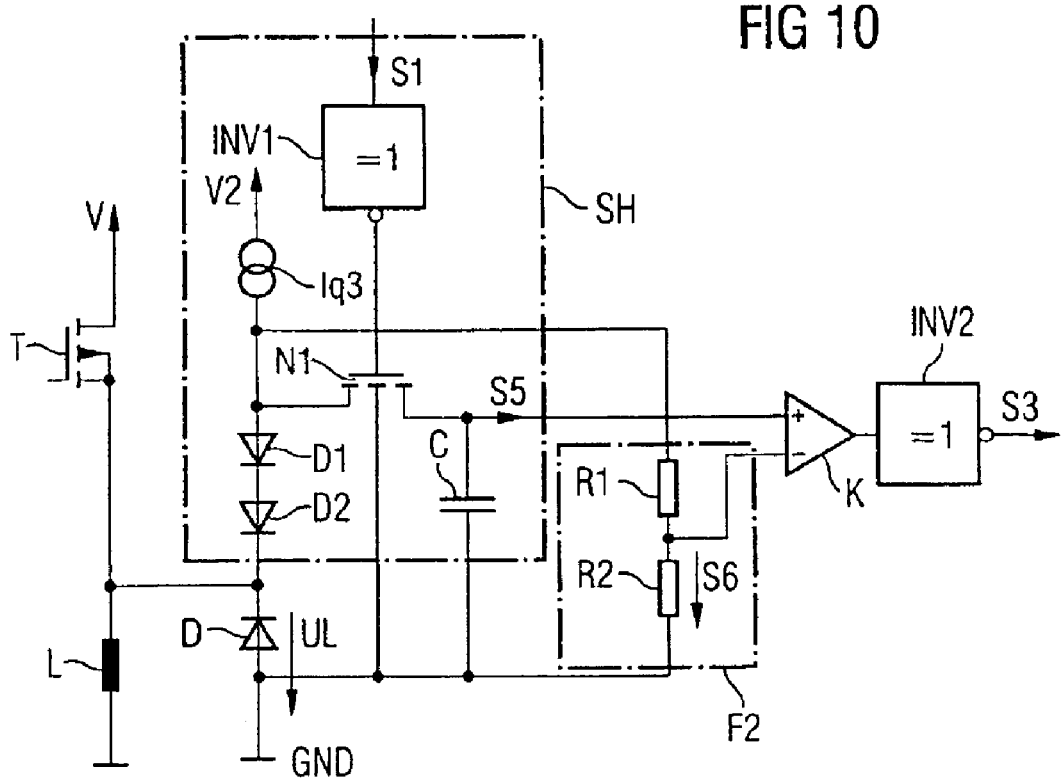
FIG. 10 illustrates an exemplary implementation of circuitry for a signal generation circuit as shown in FIGS. 5 and 7.

FIG. 10 illustrates an exemplary implementation of circuitry for the sample and hold element SH and for the function circuit F for a control signal generation circuit as shown in FIGS. 5 and 7, with understanding being improved by virtue of FIG. 10 likewise showing the semiconductor switch T, the load L and the freewheeling diode D. The sample and hold element SH comprises a series circuit with a current source Iq3 and two diodes D1, D2, which are connected between a supply potential V2 and the load L and freewheeling diode D. The sample and hold element also comprises a transistor N1 whose load path is connected between a node which is common to the current source Iq3 and to the diodes D1, D2 and a connection on a capacitor C, the other connection of the capacitor C being at reference-ground potential GND. The transistor N1 is actuated by the input signal S1 via an inverter INV1.

In the exemplary embodiment, the function circuit comprises a voltage divider with first and second resistors R1, R2 which is connected between the node which is common to the current source Iq3 and the diodes D1, D2 and reference-ground potential GND and on which the voltage measurement signal S6' can be tapped off. This voltage measurement signal is dependent on the voltage UL across the freewheeling diode D or the load L and having, in respect of this voltage UL, an offset that corresponds to the voltage drop across the two diodes D1, D2 through which the current from the current source Iq3 flows.

The current source Iq3 and the two diodes D1, D2 are used as level shifters and ensure that there is always a voltage which is positive with respect to reference-ground potential GND across the voltage divider R1, R2 and across the series circuit comprising the transistor N1 and the capacitor C.

The transistor N1 is turned on via the inverter INV1 for as long as the input signal S1 assumes a low level, that is to say for as long as the semiconductor switch T is intended not to be on. As a result, the voltage across the capacitor C follows the voltage across the series circuit comprising the two diodes D1, D2 and the freewheeling diode D, with the voltage UL across the freewheeling diode D being negative when semiconductor switch D is off and a freewheeling current is flowing.

When the input signal S1 changes to a high level, the transistor N1 turns off and the voltage across the capacitor C is held at the instantaneous value of the voltage across the diodes D1, D2 and the freewheeling diode D. If the semiconductor switch T is now turned on, the freewheeling current through the freewheeling diode is reduced, as a result of which the voltage across the diode chain D1, D2, FD and across the voltage divider R1, R2 rises at the sampling time ts. The voltage divider R1, R2 ensures that the voltage measurement signal S6', which is dependent on the load voltage UL, still has a smaller magnitude at first than the sample value S5, which [lacuna] of the voltage across the capacitor C the voltage across the freewheeling diode D, which is negative with respect to reference-ground potential, is reduced and the voltage which is positive with respect to reference-ground potential GND corresponds. These two signals S5, S6' are supplied to the comparator K. The output level from the comparator changes when the voltage across the diode chain D1, D2, FD has risen to such an extent that the voltage measurement signal S6' is larger than the sample value S5. The control signal S3, which corresponds to the inverted output signal from the comparator K via an inverter INV, then assumes a high level in order to start flattening the current edge using the driver circuit DRV in the manner explained above.

Figure 11:
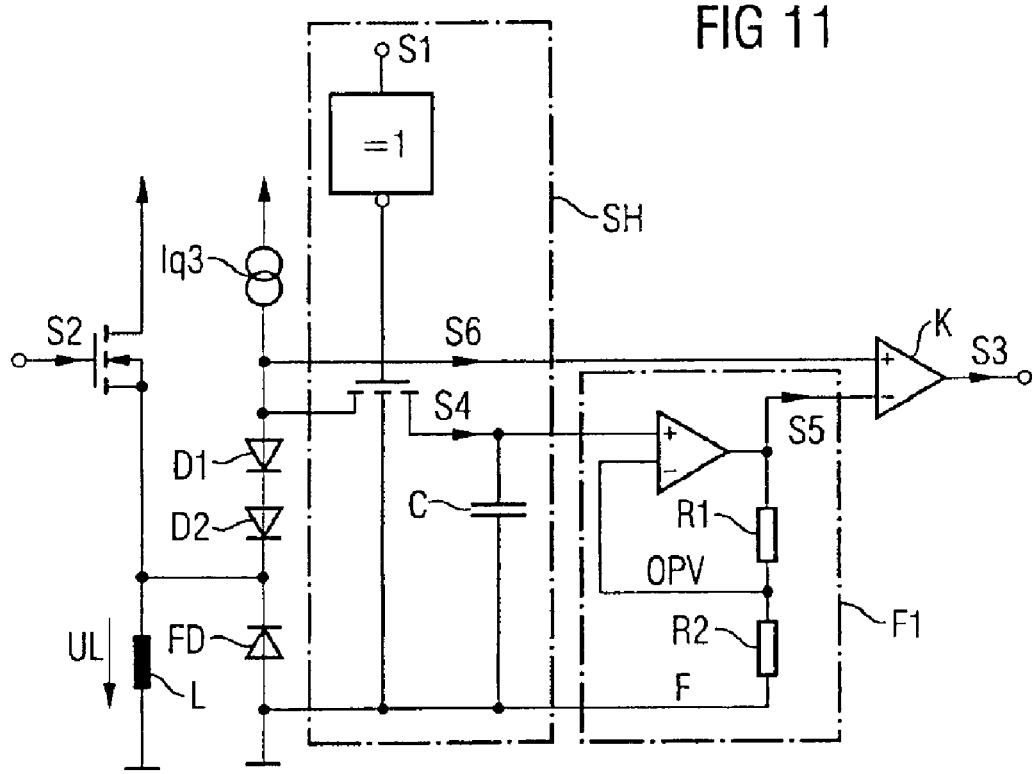
FIG. 11 illustrates an exemplary implementation of circuitry for a signal generation circuit as shown in FIGS. 3 and 6.

FIG. 11 illustrates an exemplary implementation of circuitry for the sample and hold element SH and for the function circuit F for a control signal generation circuit as shown in FIGS. 3 and 6, which differs from that shown in FIG. 10 in that the voltage measurement signal derived from the load voltage UL is supplied to the comparator K directly, while the sample signal S4 is supplied to the comparator K via a function circuit F1. In the example, this function circuit comprises an operational amplifier OPV, of which one input is supplied with the sample signal S4 and whose other input is supplied with the output signal from the operational amplifier OPV, divided by means of a voltage divider R1, R2. The output signal from the operational amplifier OPV forms the reference signal S5 for comparison with the voltage measurement signal S6. The ratio between the sampled signal S4 and the reference signal S5, which are proportional to one another in the example, is determined by the division ratio of the voltage divider R1, R2 at the output of the operational amplifier.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement for actuating a semiconductor switch connected in series with an inductive load, the circuit arrangement comprising:
   a first input terminal for supplying an input signal;
   a second input terminal for supplying a voltage measurement signal;
   an output terminal for providing an actuation signal to the semiconductor switch;
   a control signal generation circuit configured to receive the first input signal and to sense a value of the voltage measurement signal based on the first input signal in order to provide a sample value, wherein the control signal generation circuit generates a control signal on the basis of a comparison that involves the sample value and the voltage measurement signal; and
   a driver circuit connected between the first input terminal and the output terminal, wherein the driver circuit generates the actuation signal based on the control signal for a given level of the input signal, wherein the actuation signal has a signal profile.

2. The circuit arrangement of claim 1, wherein the control signal generation circuit generates the control signal based on a comparison between the voltage measurement signal and a reference signal, which is dependant on the sample value.

3. The circuit arrangement of claim 2, wherein the reference signal is between 60% and 95% of the sample value.

4. The circuit arrangement of claim 2, wherein the reference signal is between 70% and 80% of the sample value.

5. The circuit arrangement of claim 1, wherein the control signal generation circuit generates the control signal based on a comparison between the sample value and a signal that is related to the voltage measurement signal.

6. The circuit arrangement of claim 5, wherein the signal that is related to the voltage measurement signal corresponds to 0.95–1 to 0.6–1 times the voltage measurement signal.

7. The circuit arrangement of claim 5, wherein the signal that is related to the voltage measurement signal corresponds to 0.7–1 to 0.8–1 times the voltage measurement signal.

8. The circuit arrangement of claim 1, wherein the control signal generation circuit generates the sample value upon every rising edge of the input signal.

9. The circuit arrangement of claim 1, wherein the control signal generation circuit generates the sample value upon every falling edge of the input signal.

10. The circuit arrangement of claim 1, wherein the control signal generation circuit comprises:
    a sensing element to which the input signal and the voltage measurement signal are supplied and which takes a stipulation by the input signal as a basis for sensing a value of the voltage measurement signal and provides the sample value that is dependent on the voltage measurement signal;
    a reference value generation circuit which provides a reference value from the sample value; and
    a comparator arrangement which compares the reference value with the voltage measurement signal and provides the control signal on the basis of the result of the comparison.

11. The circuit arrangement of claim 10, wherein the sensing element is a sample and hold element.

12. The circuit arrangement of claim 10, wherein the sensing element is a peak value sensing and storage element.

13. The circuit arrangement of claim 1, further comprising:
    a sensing element to which the input signal and the voltage measurement signal are supplied and which takes a stipulation by the input signal as a basis for sensing a value of the voltage measurement signal and provides the sample value that is dependent on the voltage measurement signal;
    a filter circuit which takes the voltage measurement signal and provides a signal which is dependent thereon;
    a comparator arrangement which compares the sample value with the signal that is dependent on the voltage measurement signal, and provides the control signal on the basis of the comparison result.

14. The circuit arrangement of claim 1, wherein the driver circuit generates, for a first level of the input signal, an actuation signal with an actuation pattern on the basis of the control signal.

15. The circuit arrangement of claim 14, wherein the actuation pattern has been chosen such that a charging current on a control connection on the semiconductor switch is reduced for a prescribed length of time.

16. A method for generating an actuation signal for a semiconductor switch connected in series with an inductive load, the method comprising the steps:
    providing an input signal that controls whether the semiconductor switch is on or off;
    providing a voltage measurement signal that is dependent on a voltage across the load;
    sensing a value of the voltage measurement signal based on the input signal in order to provide a sample value that is dependent on the voltage measurement signal;

generating a control signal based on a comparison involving the sample value and the voltage measurement signal; and generating an actuation signal with an actuating pattern on the basis of the control signal.

17. The method of claim 16, wherein the voltage measurement signal is compared with a reference value, which is dependent on the sample value, and wherein the reference value is between 60% and 95% of the sample value.

18. The method of claim 16, wherein the voltage measurement signal is compared with a reference value, which is dependent on the sample value, and wherein the reference value is between 70% and 80% of the sample value.

19. The method of claim 16, wherein the sample value is compared with a value dependent on the voltage measurement signal, and wherein the value dependent on the voltage measurement signal corresponds to 0.95–1 to 0.6–1 times the voltage measurement signal.

20. The method of claim 16, wherein the sample value is compared with a value dependent on the voltage measurement signal, and wherein the value dependent on the voltage measurement signal corresponds to 0.7–1 to 0.8–1 times the voltage measurement signal.

21. The method of claim 16, wherein the actuation signal has a first signal profile for a first level of the input signal and for a first level of the control signal and has a second signal profile for a first level of the input signal and for a second level of the control signal.

22. The method of claim 21, wherein the second signal profile is chosen such that a charging current on a control connection on the semiconductor switch is reduced for a prescribed period of time in order to round off an edge of the current profile of a load current through the semiconductor switch.

* * * * *